(12) United States Patent
Shepston et al.

(10) Patent No.: US 6,907,376 B2
(45) Date of Patent: Jun. 14, 2005

(54) SYSTEMS AND METHODS FOR FACILITATING TESTING OF PAD RECEIVERS OF INTEGRATED CIRCUITS

(75) Inventors: Shad R. Shepston, Firestone, CO (US); Jeffrey R. Rearick, Fort Collins, CO (US); John G. Rohrbaugh, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 126 days.

(21) Appl. No.: 10/383,668

(22) Filed: Mar. 7, 2003

(65) Prior Publication Data

US 2003/0158691 A1 Aug. 21, 2003

Related U.S. Application Data

(63) Continuation of application No. 09/723,831, filed on Nov. 28, 2000, now Pat. No. 6,577,980.

(51) Int. Cl.[7] .............................................. G06F 11/32
(52) U.S. Cl. ........................................ 702/117; 716/4
(58) Field of Search ............................ 702/117, 57–59, 702/81, 84, 118, 121, 124, 188, 64, 189, 120, 126; 73/863.01; 716/4, 18; 714/25, 30, 32, 33, 37, 48

(56) References Cited

U.S. PATENT DOCUMENTS

| 5,682,392 A | 10/1997 | Raymond et al. |
| 5,796,260 A | 8/1998 | Agan |
| 5,977,775 A | 11/1999 | Chandler et al. |
| 6,275,962 B1 | 8/2001 | Fuller et al. |
| 6,324,485 B1 | 11/2001 | Ellis |
| 6,365,859 B1 | 4/2002 | Yi et al. |
| 6,396,279 B1 | 5/2002 | Gruenert |
| 6,397,361 B1 | 5/2002 | Saitoh |
| 6,577,980 B1 * | 6/2003 | Shepston et al. ........... 702/117 |

OTHER PUBLICATIONS

Haulin, Tord, "Built–in Parameric Test for Controlled Impedance I/Os," Ericsson Telecom, S.126 25 Stockholm, Sweden, pp. 123–128.

Niggemeyer, M. Ruffer,, "Parametric Built–in Self Test of VLSI Systems," Laboratory for Information Technology, University of Hannover, Germany.

\* cited by examiner

Primary Examiner—Edward Raymond

(57) ABSTRACT

A preferred integrated circuit for facilitating receiver trip level testing functionality includes a first pad which incorporates a first driver and a first receiver. The first driver is configured to provide a first pad output signal to a component external to the IC. The first receiver is configured to receive a first pad input signal from a component external to the IC, and to provide a first receiver digital output signal to a component internal to the IC in response to the first pad input signal. Additionally, a first test circuit is provided that is arranged internal to the IC, with the first test circuit being adapted to provide information corresponding to at least one receiver trip-level characteristic of the first receiver of the first pad. Systems, methods and computer readable media also are provided.

12 Claims, 11 Drawing Sheets

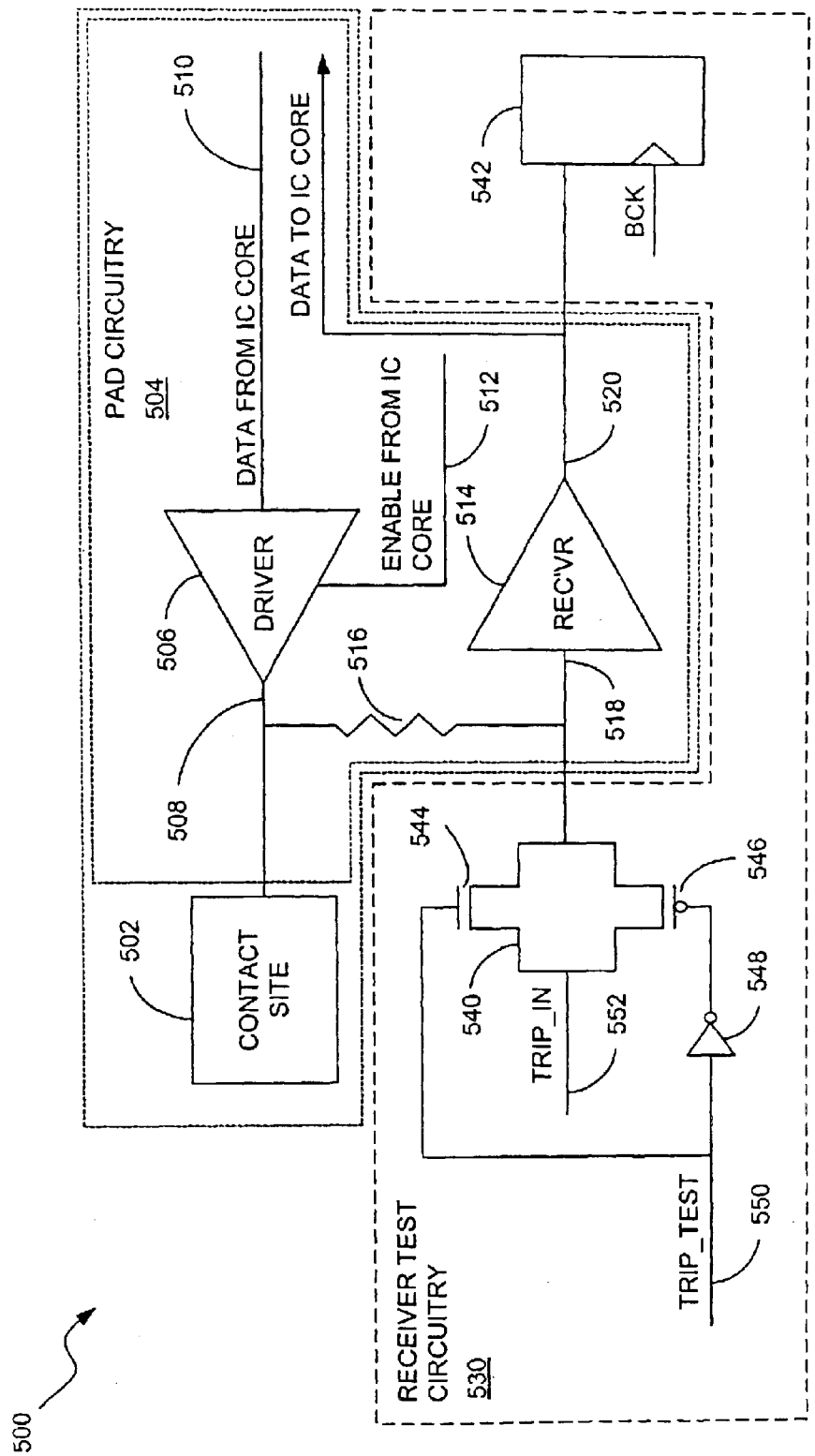

SYSTEMS AND METHODS FOR FACILITATING TESTING OF PAD RECEIVERS OF INTEGRATED CIRCUITS

CROSS-REFERENCE TO RELATED APPLICATION

This application is a continuation of U.S. utility application entitled, "Systems and Methods for Facilitating Testing of Pad Receives of Integrated Circuits," having Ser. No. 09/723,831, filed Nov. 28, 2000 now U.S. Pat. No. 6,577,980, which is entirely incorporated herein by reference.

BACKGROUND OF THE INVENTION

1. Field of the Invention

The present invention generally relates to integrated circuits and, in particular, to systems and methods for facilitating, within an integrated circuit, receiver trip level testing of pads of the integrated circuit.

2. Description of the Related Art

Heretofore, integrated circuit (IC) devices have been tested and verified using a variety of test methods. For example, IC devices have been tested and verified to be defect-free using functional test vectors, such as those applied to the IC by the use of automated test equipment (ATE), which stimulate and verify the IC device functionality at the pin level of the device. A practical limitation to the utilization of ATE for testing IC's, however, is that the number of IC pins (or pads) that can be tested by a particular ATE has, heretofore, been limited by the physical configuration of the ATE. For instance, the number of pads of the IC to be tested may exceed the number of test channels provided by an ATE, or the number of pads may exceed the capacity of the ATE support hardware, such as by exceeding the maximum number of probes on a probe card, among others. As utilized herein, the term "pad" is used to refer collectively to both a physical site, which serves as an electrical contact for an IC, as well as circuitry associated with the physical site for enabling electrical communication between components of the IC and components external to the IC.

Additionally, performance limitations of a particular ATE may impose certain other testing restrictions. For example, the frequency of IC inputs and outputs may exceed the maximum frequency of the ATE, thereby limiting the test frequency of the IC to be tested to the maximum frequency of the ATE. Although configuring an ATE with additional test channels and/or a higher operating frequency may be accomplished, providing an ATE with an appropriately high pin count and/or an appropriately high operating frequency in order to eliminate the aforementioned deficiencies is, oftentimes, cost prohibitive.

In light of the foregoing and other deficiencies, it is known in the prior art to test IC devices utilizing a variety of "stop-gap" testing procedures, including: (1) connecting an ATE to less than all of the pins of an IC device; (2) connecting multiple pins of an IC device to a single ATE test channel; (3) testing the IC device in multiple passes of the ATE, with each pass testing a subset of the pins of the entire IC device; (4) testing the device at less than maximum frequency, and; (5) limiting, through design implementation, the pin count and/or frequency of the IC device to accommodate existing ATE, among others. As should be readily apparent, many of these "stop-gap" testing procedures may result in a loss of test coverage and, thereby, may lead to an increase in numbers of defective IC devices being shipped. Moreover, the practice of limiting, through design implementation, the pin count and/or frequency of the IC device to accommodate existing ATE is, oftentimes, an unacceptable constraint on IC design.

Therefore, there is a need for improved systems and methods which address these and other shortcomings of the prior art.

SUMMARY OF THE INVENTION

Briefly described, the present invention provides receiver trip level testing functionality within integrated circuits. In this regard, some embodiments of the present invention may be construed as providing integrated circuits (IC's). In a preferred embodiment, the integrated circuit includes a first pad incorporating a first driver and a first receiver. The first driver is configured to provide a first pad output signal to a component external to the IC. The first receiver is configured to receive a first pad input signal from a component external to the IC, and to provide a first receiver digital output signal to a component internal to the IC in response to the first pad input signal. Additionally, a first test circuit is provided that is arranged internal to the IC, with the first test circuit being adapted to provide information corresponding to at least one receiver trip-level characteristic of the first receiver of the first pad.

In an alternative embodiment, the integrated circuit includes a first pad incorporating a first driver and a first receiver, and means for providing information corresponding to at least one receiver trip-level characteristic of the first receiver of the first pad.

Some embodiments of the present invention may be construed as providing systems for measuring receiver trip-level characteristics. In this regard, a preferred embodiment includes automated test equipment (ATE) and an integrated circuit (IC). Preferably, the ATE is configured to electrically interconnect with the IC and to provide at least one stimulus to the IC. The IC includes a first pad that incorporates a first driver, a first receiver and a first test circuit. The first driver is configured to provide a first pad output signal to the ATE. The first receiver is configured to receive a first pad input signal from the ATE and to provide a first receiver digital output signal to a component internal to the IC in response to the first pad input signal. Additionally, the first test circuit is configured to electrically communicate with the ATE so that, in response to receiving at least one stimulus from the ATE, the first test circuit provides information to the ATE corresponding to at least one receiver trip-level characteristic of the first receiver of the first pad.

Some embodiments of the present invention may be construed as providing methods for testing an integrated circuit. In this regard, a preferred method includes the steps of: electrically interconnecting ATE with the IC; providing at least one stimulus from the ATE to the IC so that the IC measures a receiver trip-level characteristic of the first pad of the IC; and receiving information corresponding to a receiver trip-level characteristic of the first pad.

Other embodiments of the present invention may be construed as providing computer readable media. In this regard, a preferred computer readable medium, which incorporates a computer program for facilitating measuring of a receiver trip-level characteristic of an IC, includes: logic configured to enable ATE to provide at least one stimulus to the IC so that a first test circuit provides information corresponding to at least one receiver trip-level characteristic of a first receiver of the IC; and logic configured to enable the ATE to receive, from the first test circuit, the information corresponding to the at least one receiver trip-level characteristic of the first receiver.

Other features and advantages of the present invention will become apparent to one with skill in the art upon examination of the following drawings and detailed description. It is intended that all such features and advantages be included herein within the scope of the present invention, as defined in the appended claims.

BRIEF DESCRIPTION OF THE SEVERAL VIEWS OF THE DRAWINGS

The present invention, as defined in the claims, can be better understood with reference to the following drawings. The drawings are not necessarily to scale, emphasis instead being placed on clearly illustrating the principles of the present invention.

FIG. 5B is a schematic diagram depicting a preferred embodiment of the present invention.

DETAILED DESCRIPTION OF A PREFERRED EMBODIMENT

Figure 1:
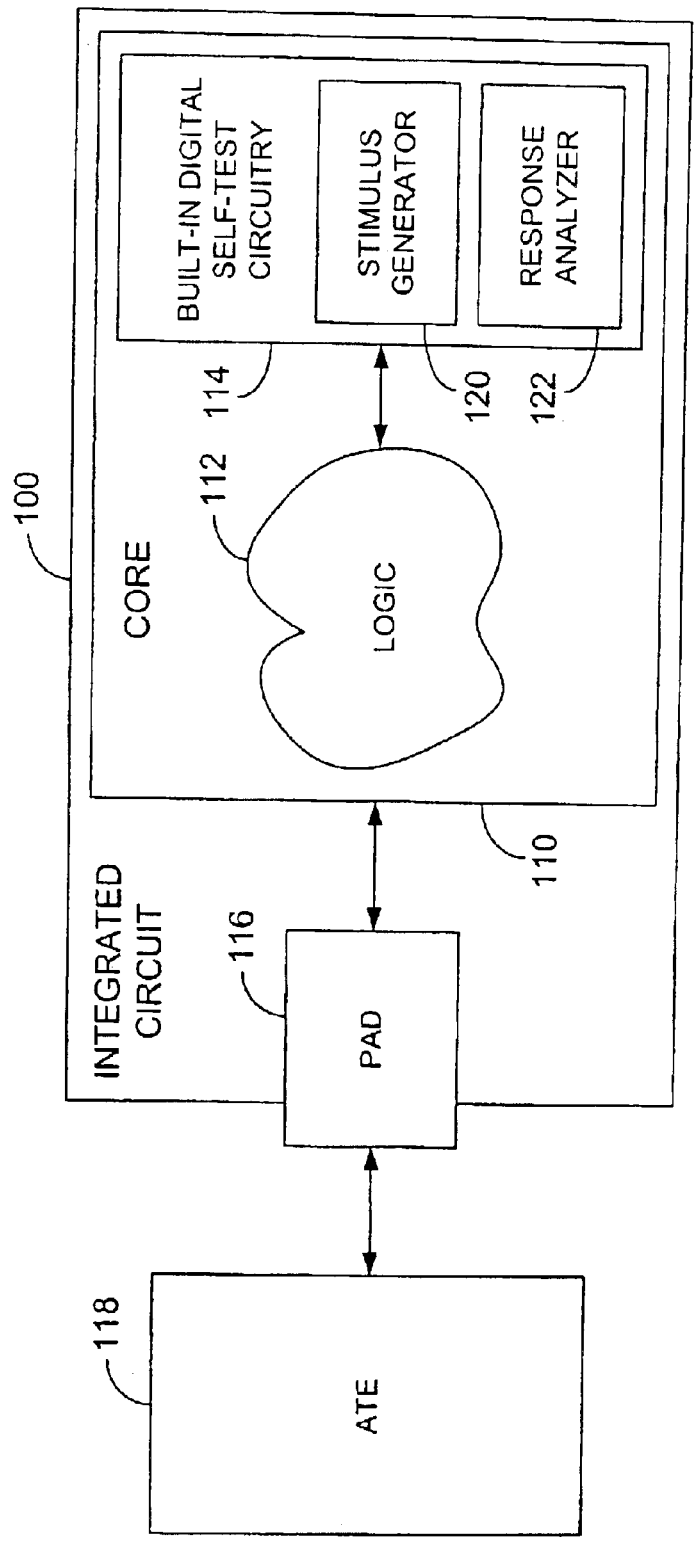
FIG. 1 is a schematic diagram depicting a representative integrated circuit incorporating digital self-test circuitry of the prior art.

Reference will now be made in detail to the description of the invention as illustrated in the drawings with like numerals indicating like parts throughout the several views. As mentioned briefly hereinbefore, it is known to incorporate built-in (digital) self test circuitry into an integrated circuit. Referring now to FIG. 1, a representative integrated circuit 100 incorporating such built-in self-test circuitry will be described in greater detail.

As shown in FIG. 1, integrated circuit 100 includes a core 110 which incorporates logic 112 and digital self-test circuitry 114. Core 110 electrically communicates with pad 116 which is configured to electrically communicate with devices external to the integrated circuit, such as a piece of automated test equipment (ATE) 118, for example. So configured, signals provided from an external device, e.g., ATE 118, may be delivered to the core 110 via a transmission path which includes pad 116.

As is known, digital self-test circuitry 114 is configured to provide functional-based digital testing of logic circuitry contained within core 110. In order to accomplish such testing, digital self-test circuitry 114 typically incorporates a stimulus generator 120 and a response analyzer 122. More specifically, stimulus generator 120 is configured to provide one or more test patterns for testing logic circuitry of the core. The pattern or patterns provided to the logic circuitry are comprised of digital data, i.e., zeros and ones. In response to the various patterns, the logic circuitry under test then provides a response signal or signals to the response analyzer 122 which is able to interpret the response and provide a test result signal, which may be provided externally of the integrated circuit. Thus, the digital self-test circuitry provides for digital, functional testing of the core by applying digital test patterns to the logic circuitry of the core and has, heretofore, substantially removed the need for external test equipment, i.e., ATE 118, to provide stimulus to and check responses from the integrated circuit for facilitating testing of the digital logic circuitry.

Figure 2:
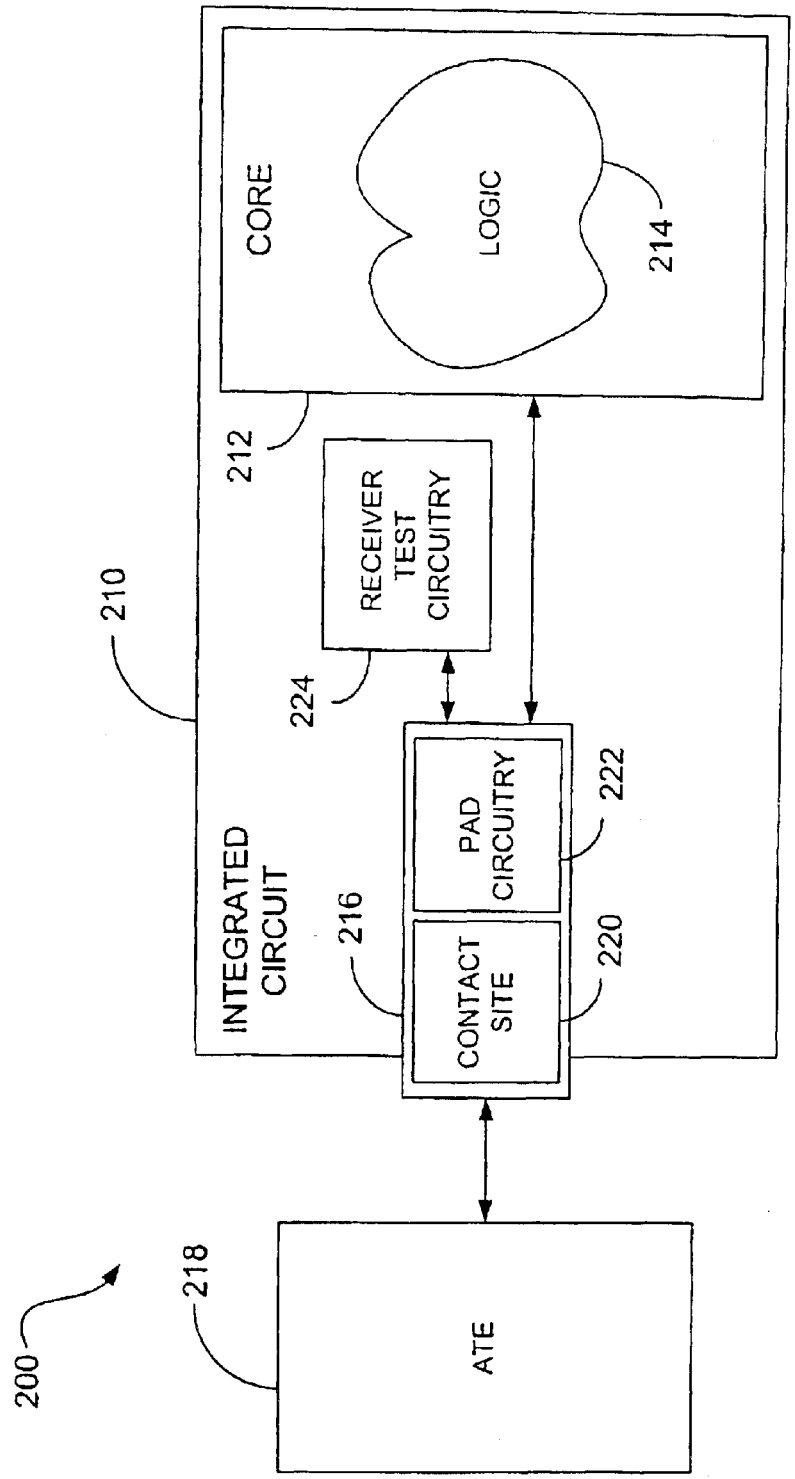
FIG. 2 is a schematic diagram depicting a preferred embodiment of the present invention.

Utilizing the digital self-test circuitry of FIG. 1 as a point of comparison, general characteristics of a preferred embodiment of the receiver test system of the present invention will now be described in reference to the schematic diagram of FIG. 2. As depicted in FIG. 2, receiver test system 200 incorporates an integrated circuit 210 which includes a core 212. Core 212 incorporates logic 214 and electrically communicates with a pad 216, which is configured to allow intercommunication of the logic with devices, such as ATE 218, for example, external to the integrated circuit. As mentioned hereinbefore, a pad, such as pad 216, includes a physical or contact site 220, which serves as an electrical contact for IC 210, as well as pad circuitry 222, which cooperates with the contact site to enable electrical communication between components of the IC and components external to the IC. As is known, pad circuitry may include one or more of a receiver, for receiving signals provided to the pad, and a driver, for providing signals to external devices.

Additionally, integrated circuit 210 incorporates receiver test circuitry 224 which electrically communicates, either directly or indirectly, with pad 216. As described in detail hereinafter, receiver test circuitry 224 is configured to provide selected ATE functionality and, thereby, reduces the necessity for specialized external automated test equipment for testing integrated circuits of various configurations. It should be noted that, although receiver test circuitry 224 is depicted in FIG. 2 as residing outside core 212 and outside the pad 216, various other arrangements of test circuitry 224 may be utilized, such as arranging the test circuitry within the core or within the pad, for instance. Moreover, the test circuitry may be configured to communicate with the ATE via a pad other than the pad to be tested, i.e., a pad other than pad 216.

As mentioned hereinbefore, ATE typically provides the ability to test a wide variety of integrated circuits. Oftentimes, however, the full testing capability of a given ATE is usually not required to test a specific type of integrated circuit. Additionally, the number of pads of an integrated circuit may exceed the number of test channels of a given ATE, thereby necessitating the use of an ATE with an increased number of tester channels or necessitating the use of less than optimal testing procedures, e.g., testing fewer than all of the pads of an integrated circuit simultaneously, for instance.

By providing receiver test circuitry "on-chip," the testing of integrated circuits, such as integrated circuit 210, may be implemented utilizing conventional ATE whereby test capability not typically provided by the conventional ATE may be provided by the receiver test circuitry. So provided, the receiver test circuitry has the ability to provide testing capability that a given ATE does not provide, or is not able to provide, while utilizing various capabilities that a given ATE does provide. Thus, the testing system 200 of the present invention may facilitate efficient and effective testing of integrated circuits that draws from at least some of the inherent strengths of conventional ATE, e.g., reduced costs, while providing potentially improved testing performance.

By utilizing the receiver test circuitry of the present invention, testable pin count of an integrated circuit is not necessarily limited by the ATE, such as by the tester channel configuration of a given ATE. For instance, the ATE may provide signals, such as scan test signals and resets, for example, to some pads of an integrated circuit under test, while leaving other pads to be tested by the receiver test circuitry. Additionally, utilization of the receiver test circuitry makes it possible to test the integrated circuits at frequencies greater than the test frequency limit of the ATE.

Figure 3:
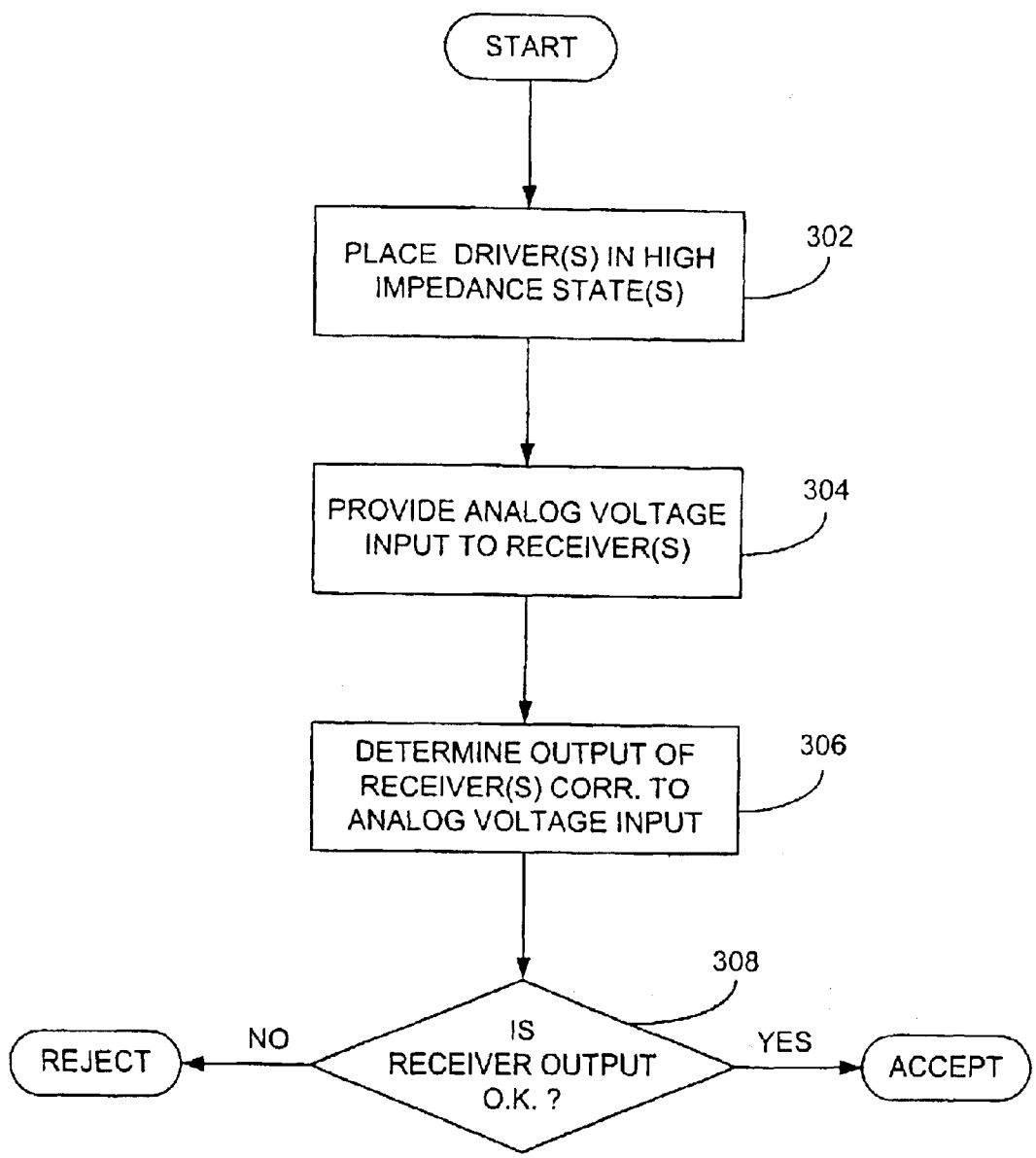
FIG. 3 is a flowchart depicting the functionality of a preferred embodiment of the present invention.

As depicted in FIG. 3, a preferred embodiment of the present invention, which may be construed as a method for performing certain testing functionality, preferably begins at block 302 where the drivers of one or more pads of an integrated circuit are disabled, such as by placing the driver (s) in a high impedance state(s), for example. Thereafter, analog voltage input may be provided to respective receivers of the disabled drivers (block 304). Preferably, the voltage of the analog voltage input is set to an appropriate level for determining whether the receiver is properly responding to a given input voltage. More specifically, the analog input voltage may be set to a level at or below the receiver low voltage trip level ($V_{IL}$), and/or to a level at or above the receiver high voltage trip level ($V_{IH}$). So provided, the analog voltage input may be set to a level that should cause a receiver to output a logic low ("0"), i.e., the analog voltage input is at or below $V_{IL}$, and/or a logic high ("1"), i.e., the analog voltage input is at or above $V_{IH}$. Thus, if such an analog voltage is provided to the input of the receiver and an appropriately corresponding logic output from the receiver is not identified (block 306), the receiver may be rejected as being defective (block 314).

Figure 4:
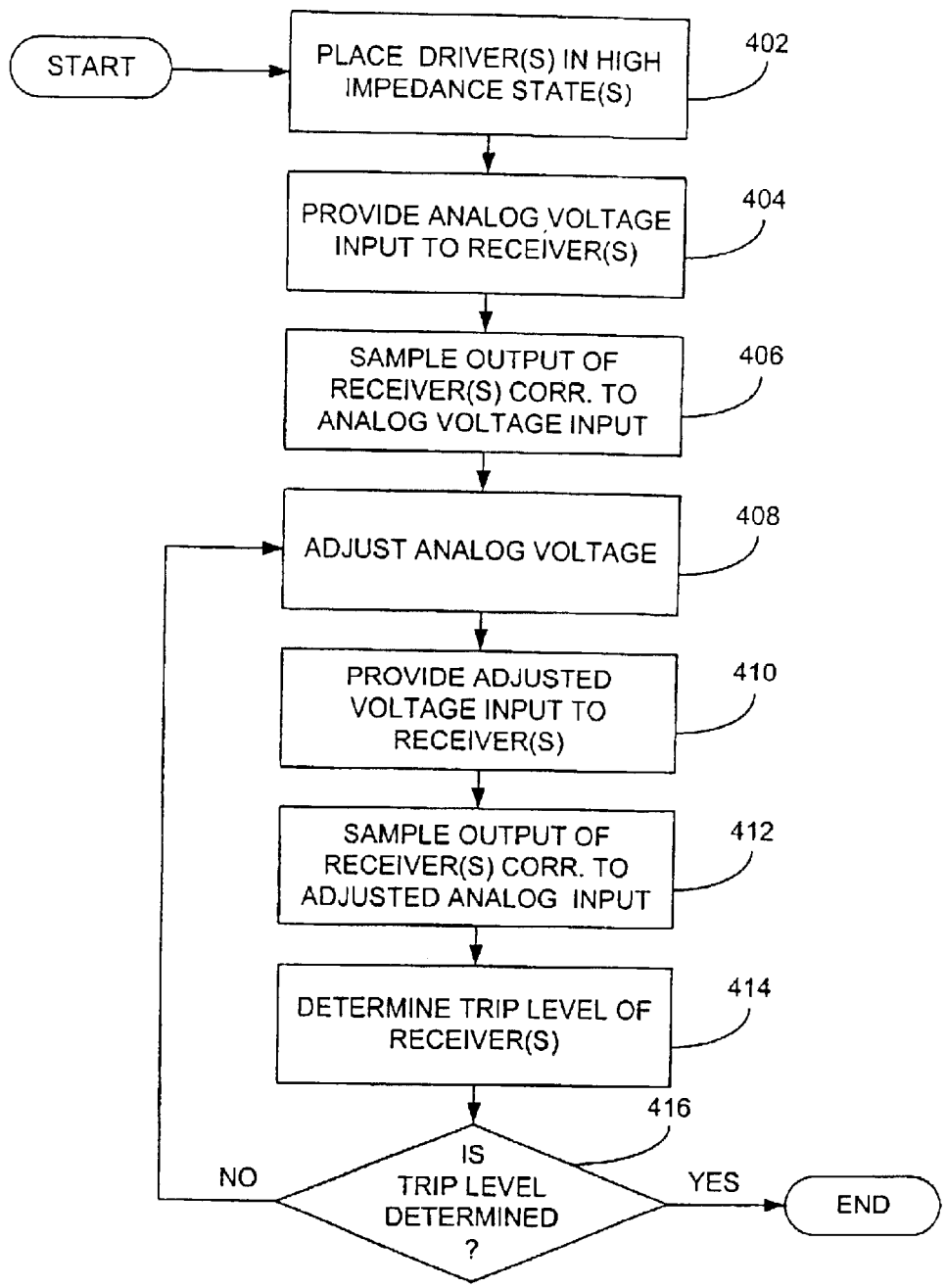
FIG. 4 is a flowchart depicting the functionality of a preferred embodiment of the present invention.

Referring now to FIG. 4, a preferred embodiment of the present invention for determining various performance characteristics, such as receiver low voltage input ($V_{IL}$) and receiver high voltage input ($V_{IH}$), for example, of receivers of an integrated circuit will be described. As described in relation to the embodiment depicted in FIG. 3, the embodiment of FIG. 4 also preferably begins by disabling the drivers of one or more pads of an integrated circuit (block 402), such as by placing the driver(s) in a high impedance state(s), for example. Thereafter, analog voltage input may be provided to respective receivers of the disabled drivers (block 404). Preferably, the voltage of the analog voltage input is set to an appropriate level for determining whether the receiver is properly responding to a given input voltage. In block 406, outputs of the receivers are sampled and a determination is made as to whether the outputs properly correspond to the analog voltage inputs. Proceeding to block 408, the analog voltage input may be adjusted, e.g., adjusted to be higher or lower voltage than the previously applied analog voltage input depending upon the particular characteristic to be determined. The adjusted voltage may then be provided to the receivers, as depicted in block 410. For instance, if receiver low voltage input is to be determined, an analog voltage first to be provided to the receiver preferably is selected so that the receiver outputs a logic "high". The analog input voltage then may be decreased in appropriate increments so that the actual receiver low voltage input may be established, i.e., the actual receiver low voltage input resides between the last analog input voltage to result in a logic "high" output from the receiver and the first analog input voltage to result in a logic "low" output from the receiver.

Outputs of the receivers corresponding to the adjusted analog voltage inputs may then be determined, such as depicted in block 412. Proceeding to block 414, a determination may be made as to whether trip level of the respective receivers has been established. If receiver trip levels have been determined, the process may end. If, however, the receiver trip levels have not been determined, the process may return to block 408, and proceed as described hereinbefore, until the receiver trip levels are established.

Figure 5A:
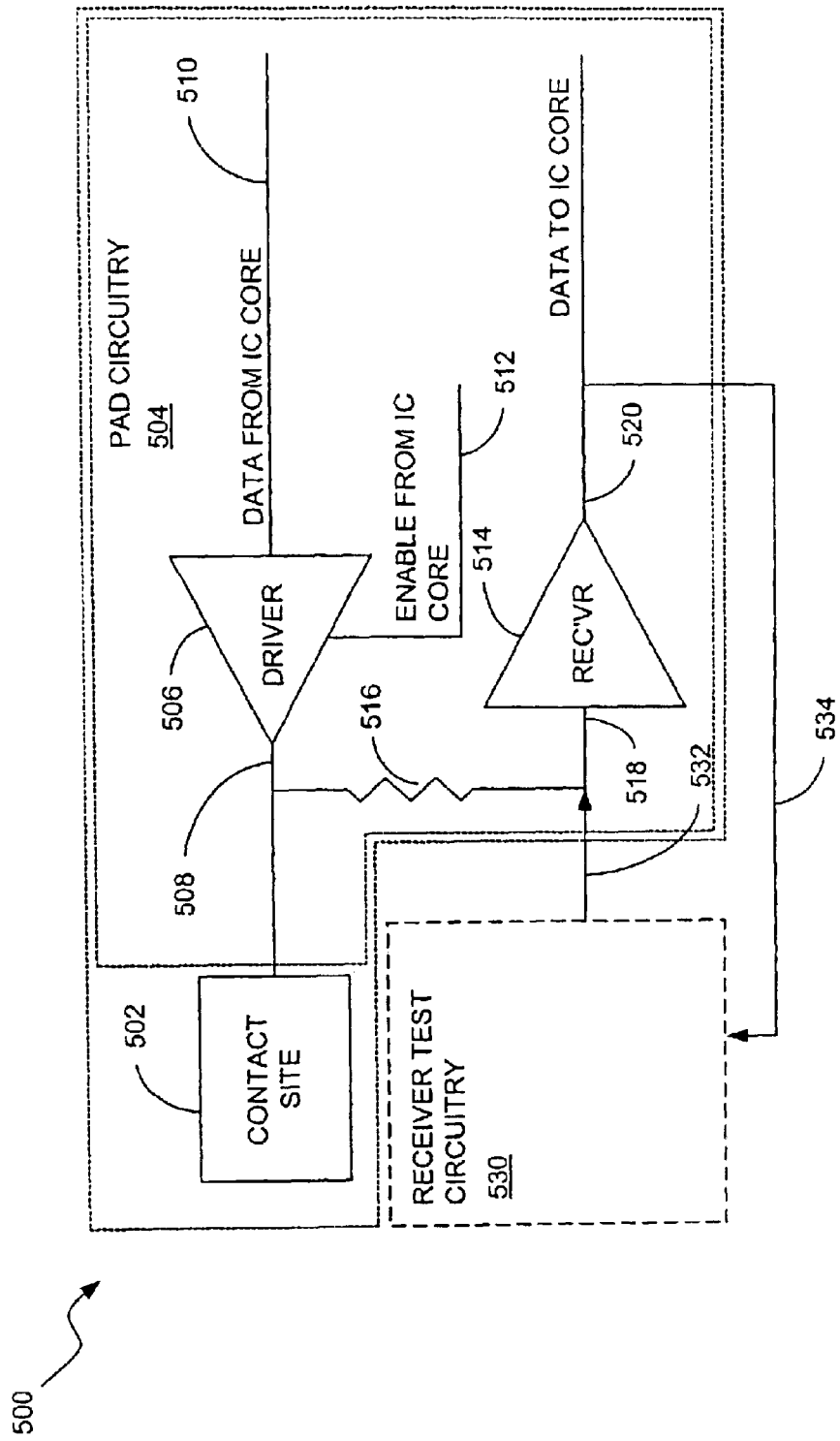
FIG. 5A is a schematic diagram depicting a preferred embodiment of the present invention.

Reference will now be made to FIG. 5A, which depicts a preferred embodiment of the present invention. As shown in FIG. 5A, and as mentioned briefly hereinbefore, a pad of an integrated circuit includes both a contact site, e.g., contact site 502, and pad circuitry associated with the contact site, e.g., pad circuitry 504. Circuitry 504 includes a driver 506 that electrically communicates with the contact site 502, such as by lead 508. Driver 506 is configured to receive a data signal 510 from the IC core, described hereinbefore, and a driver enable signal 512 from the IC core. Driver 506 also is electrically interconnected to a receiver 514 with an optional resistor 516 being coupled therebetween. Receiver 514 is configured to receive an input, such as via lead 518, and is configured to provide an output, such as via lead 520, to the IC core of the integrated circuit.

FIG. 5A also depicts a preferred embodiment of receiver test circuitry 530 of the present invention. More specifically, receiver test circuitry 530 is configured to communicate with the receiver input, depicted by arrow 532, and with the receiver output, depicted by arrow 534.

Referring now to FIG. 5B, a preferred embodiment of receiver test circuitry 530 will be described in greater detail. As depicted in FIG. 5B, a preferred embodiment of receiver test circuitry 530 includes an analog pass gate 540 and a flip-flop 542. The analog pass gate 540 electrically communicates with the input of receiver 514, and the flip flop 542 electrically communicates with the output of receiver 514. Analog pass gate 540 includes an N-mos transistor 544 and a P-mos transistor 546 that cooperate so as to provide analog voltages of various voltage levels to the receiver 514. In order to facilitate such an analog voltage, an inverter 548 is provided which electrically communicates with P-mos transistor 546 and which is adapted to receive a TRIP_TEST signal 550, which typically is provided as a stimulus from automated test equipment. For instance, when TRIP_TEST is low, i.e., "zero", the analog pass gate is inactive; however, when TRIP_TEST is high, i.e., "one", the P-mos and N-mos transistors cooperate so as to activate the analog pass gate, thereby allow a TRIP_IN signal 552 to be provided to the input of the receiver 514.

Upon receiving the TRIP_IN analog voltage signal, the receiver outputs either a logic high ("one") or a logic low ("zero") which is then provided to the flip flop 542 of the test circuitry. Thus, an analog voltage may be set for the TRIP_IN signal, the control clock fired and, subsequently, the value registered by the flip flop corresponding to the TRIP_IN signal may be scanned from the flip flop and evaluated.

Figure 6:
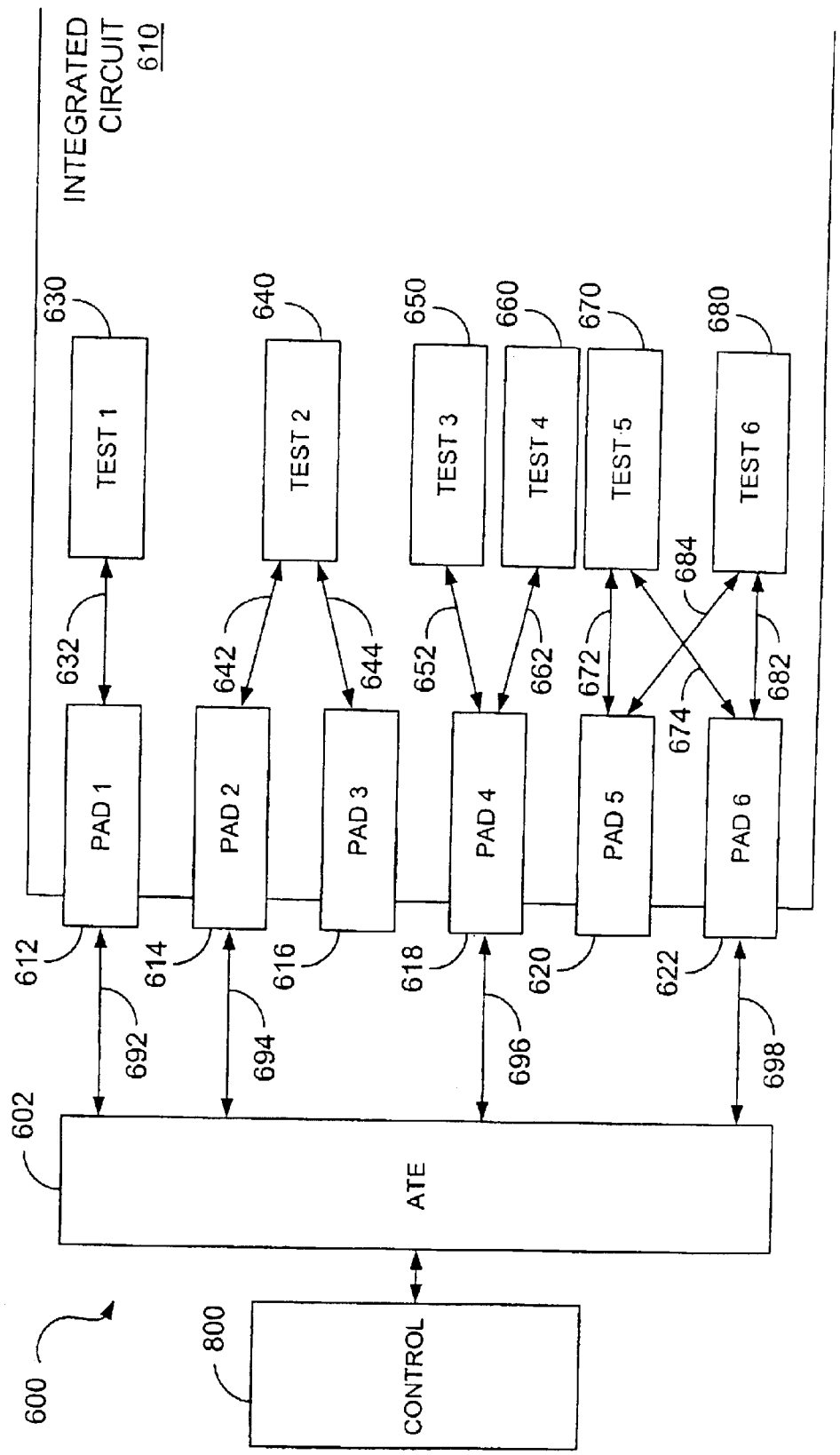
FIG. 6 is a schematic diagram depicting a preferred embodiment of the present invention.

Referring now to FIG. 6, various aspects of the present invention, including receiver test circuitry implementation and calibration will now be described in greater detail. As shown in FIG. 6, a preferred embodiment 600 of the present invention incorporates an integrated circuit 610 which includes multiple pads. In particular, integrated circuit 610 includes pads 1 through 6 (612, 614, 616, 618, 620 and 622 respectively). As depicted in FIG. 6, the integrated circuit also incorporates various receiver test circuits, such as Test 1 (630), Test 2 (640), Test 3 (650), Test 4 (660), Test 5 (670) and Test 6 (680). The various receiver test circuits electrically communicate with their respective pads in a variety of configurations. For instance, circuitry 630 communicates directly with pad 612 via transmission path 632 (in a preferred implementation, path 632 may be two unidirectional paths); circuitry 640 communicates with each of pads 614 and 616 by utilizing transmission paths 642 and 644 respectively; circuitry 650 and circuitry 660 each electrically communicate with pad 618 via transmission paths 652 and 662 respectively; circuitry 670 communicates with pads 620 and 622 via transmission path 672 and 674 respectively; and circuitry 680 also communicates with pads 620 and 622, albeit, via transmission path 682 and 684 respectively. Thus, an integrated circuit may incorporate various pad types as well as various configurations of intercommunication between the various pads and various receiver test circuits.

As an illustrative example, and not for the purpose of limitation, an integrated circuit may be configured to utilize one receiver test circuit to test multiple pads, e.g., utilizing one receiver test circuit to test multiple pads of like type. Such a configuration is represented schematically in FIG. 6 by Pad 2 and Pad 3, which are both tested by Test 2.

As shown in FIG. 6, ATE 602 electrically communicates with the test circuitry of integrated circuit 610 by utilizing a variety of transmission path configurations. For example, circuitry 630 communicates with the ATE via transmission path 632, pad 612 and transmission path 692; circuitry 640 communicates with the ATE via transmission path 642, pad 614 and transmission path 694; circuitry 650 communicates with the ATE via transmission path 652, pad 618 and transmission path 696; circuitry 660 communicates with the ATE via transmission path 662, pad 618 and transmission path 696; circuitry 670 communicates with the ATE via transmission path 674, pad 622 and transmission path 698; and circuitry 680 communicates with the ATE via transmission path 682, pad 622 and transmission path 698. Additionally, various functionality may be enabled by control 800 (described in detail hereinafter).

Figure 7:
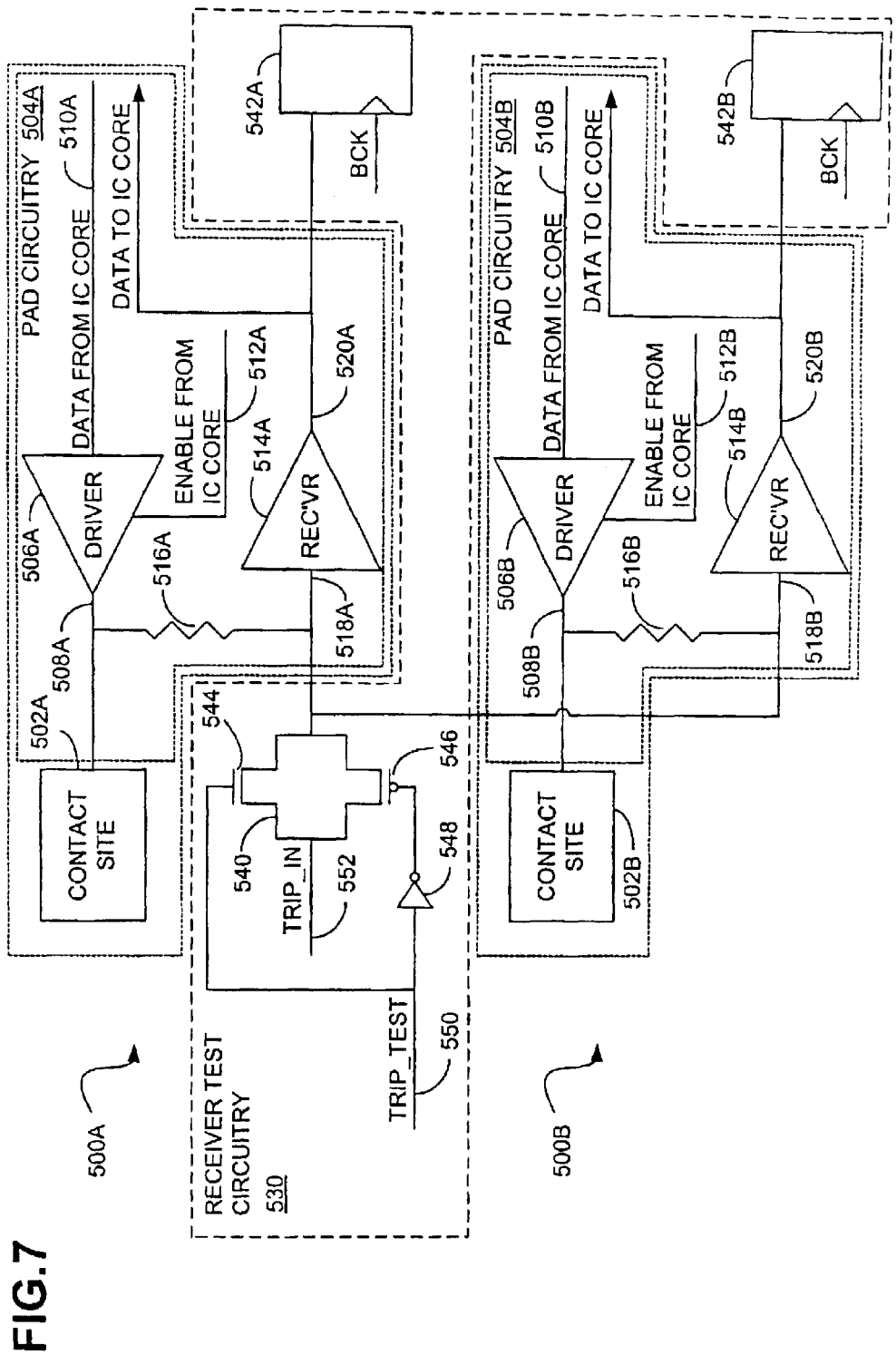
FIG. 7 is a schematic diagram depicting a preferred embodiment of the present invention.

As shown in FIG. 7, an alternative embodiment of the present invention incorporating receiver test circuitry that is configured to perform test functionality in relation to more than one pad is depicted. In particular, the embodiment depicted in FIG. 7 is adapted to provide receiver testing functionality for both pad 500A and 500B. More specifically, pad 500A incorporates contact site 502A as well as circuitry 504A. Circuitry 504A includes a driver 506A that electrically communicates with the contact site 502A, such as by lead 508A, and is adapted to receive an input 510A and a driver enable signal 512A. Driver 506A is electrically interconnected to a receiver 514A with an optional resistor 516A being coupled therebetween. Receiver 514A is configured to receive an input, such as via lead 518A, and is configured to provide an output, such as via lead 520A, to the core of the integrated circuit (herein shown as flip-flop 542A).

Similarly, pad 500B incorporates contact site 502B as well as circuitry 504B. Circuitry 504B includes a driver 506B that electrically communicates with the contact site 502B, such as by lead 508B, and is adapted to receive an input 510B and a driver enable signal 512B. Driver 506B is electrically interconnected to a receiver 514B with an optional resistor 516B being coupled therebetween. Receiver 514B is configured to receive an input, such as via lead 518B, and is configured to provide an output, such as via lead 520B, to the core of the integrated circuit (herein shown as flip-flop 542B).

Analog pass gate 540 electrically communicates with the receivers 514A and 514B. Analog pass gate 540, previously described in relation to the embodiment depicted in FIG. 5B, provides analog voltages of various voltage levels to the receivers 514A and 514B. Thus, an analog voltage may be set for the TRIP_IN signal of the analog pass gate 540, the control clock fired and, subsequently, the values registered by the flip-flops 542A and 542B may be observed and evaluated.

As described hereinbefore, the present invention is adapted to facilitate automated test equipment functionality for testing integrated circuits. In this regard, some embodiments of the present invention may be construed as providing receiver test systems for testing integrated circuits. More specifically, some embodiments of the receiver test system may include one or more receiver test circuits in combination with ATE, e.g., ATE 600 of FIG. 6, and a suitable control system, which may be implemented by control 800 of FIG. 6, for example. The control system may be implemented in hardware, software, firmware, or a combination thereof. In a preferred embodiment, however, the control system is implemented as a software package, which can be adaptable to run on different platforms and operating systems as shall be described further herein. In particular, a preferred embodiment of the control system, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device, and execute the instructions. In the context of this document, a "computer-readable medium" can be any means that can contain, store, communicate, propagate or transport the program for use by or in connection with the instruction execution system, apparatus, or device.

The computer readable medium can be, for example, but is not limited to, an electronic, magnetic, optical, electromagnetic, infrared, or semi-conductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable, programmable, read-only memory (EPROM or Flash memory) (magnetic), an optical fiber (optical), and a portable compact disk read-only memory (CDROM) (optical). Note that the computer-readable medium could even be paper or another suitable medium upon which the program is printed, as the program can be electronically captured, via for instance, optical scanning of the paper or other medium, then compiled, interpreted, or otherwise processed in a suitable manner, if necessary, and then stored in a computer memory.

Figure 8:
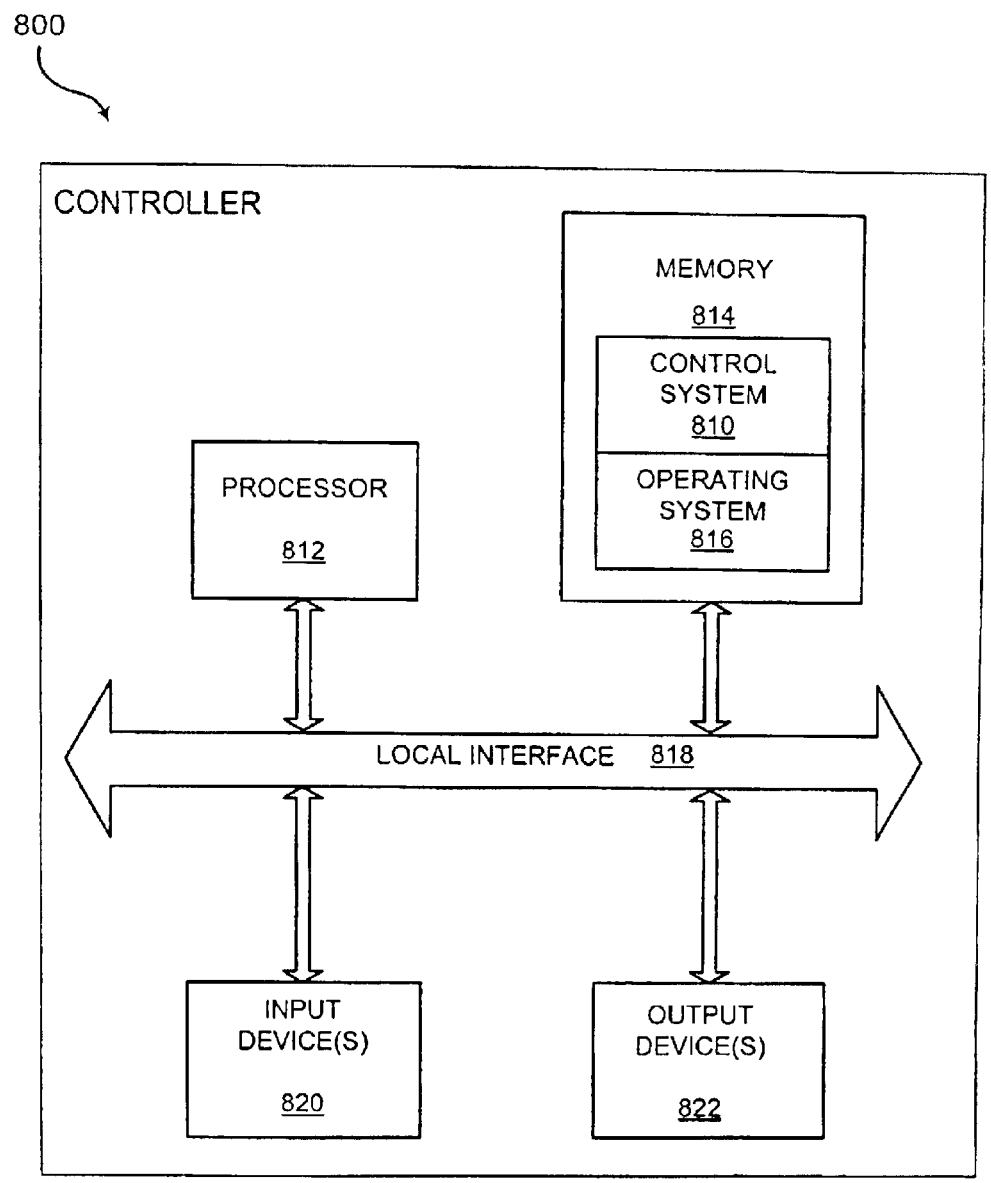
FIG. 8 is a schematic diagram depicting a representative processor-based system which may be utilized as a controller of the present invention.

FIG. 8 illustrates a typical computer or processor-based system which may facilitate functionality of the control system 810 (described in detail hereinafter) of the present invention, and thereby may be employed as a controller, e.g., controller 800 of FIG. 6. As shown in FIG. 8, the computer system generally comprises a processor 812 and a memory 814 with an operating system 816. Herein, the memory 814 may be any combination of volatile and nonvolatile memory elements, such as random access memory or read only memory. The processor 812 accepts instructions and data from memory 814 over a local interface 818, such as a bus(es). The system also includes an input device(s) 820 and an output device(s) 822. Examples of input devices may include, but are not limited to, a serial port, a scanner, or a local access network connection. Examples of output devices may include, but are not limited to, a video display, a Universal Serial Bus, or a printer port. Generally, this system may run any of a number of different platforms and operating systems, including, but not limited to, HP-UX™, Linux™, Unix™, Sun Solaris™ or Windows NT™ operating systems. The control system 810 of the present invention, the functions of which shall be described hereinafter, resides in memory 814 and is executed by the processor 812.

Figure 9:
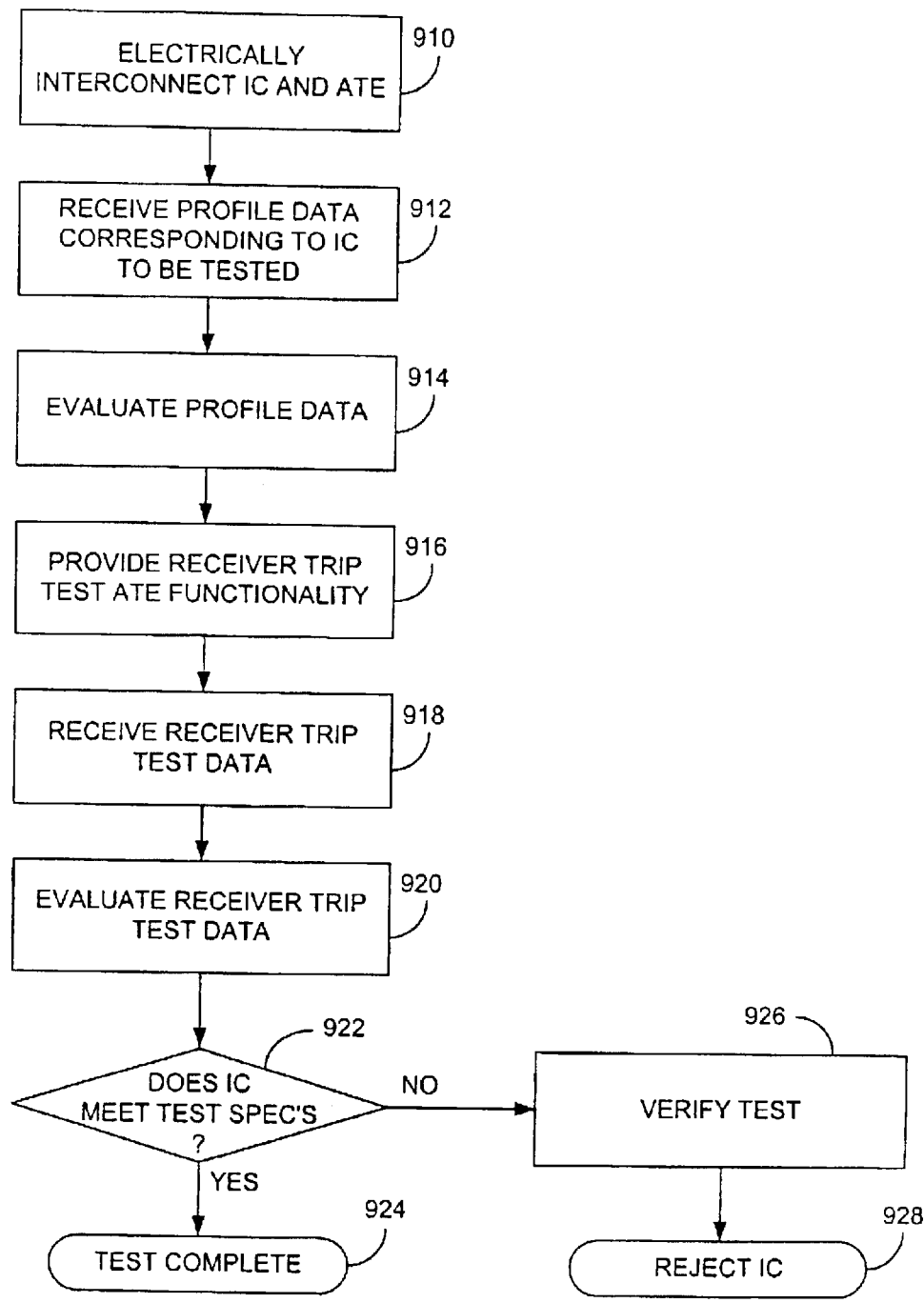
FIG. 9 is a flowchart depicting the functionality of a preferred embodiment of the present invention.

The flowchart of FIG. 9 shows the functionality and operation of a preferred implementation of the control system 810 depicted in FIG. 8. In this regard, each block of the flowchart represents a module segment or portion of code which comprises one or more executable instructions for implementing the specified logical function or functions. It should also be noted that in some alternative implementations the functions noted in the various blocks may occur out of the order depicted in FIG. 9. For example, two blocks shown in succession in FIG. 9 may, in fact, be executed substantially concurrently where the blocks may sometimes be executed in the reverse order depending upon the functionality involved.

As depicted in FIG. 9, the control system functionality (or method) preferably begins at block 910 where an IC to be tested is electrically interconnected with ATE. Proceeding to block 912, profile data corresponding to the IC to be tested may be received. Such profile data may include, but is not limited to, information relating to the type of IC and/or electrical continuity information corresponding to the interconnection of the ATE and the IC, among others. The profile data may be provided in numerous manners, such as by being provided in the form of an operator input at a work station or as a response to a test initiation signal delivered to the analog test circuitry by the ATE, for instance. After receiving the profile data, if applicable, the process preferably proceeds to block 914 where the data is evaluated, i.e., a determination is made as to whether testing may proceed.

At block 916, the IC under test is provided, by the ATE, with appropriate signals to facilitate receiver testing, such as receiver trip testing, for instance. At block 918, test data is received, such as by the ATE, with the data being received in any suitable manner, e.g., intermittently throughout the testing cycle, or after testing has been completed. At block 920, where receiver trip test data is evaluated and, then, in block 922, a determination may be made as to whether the receiver, and its associated components, are functioning as desired. If it is determined that the receiver is not functioning as desired, the process may proceed to block 926 where the test results may be verified, such as by repeating at least some of the aforementioned process steps 910–922. Thereafter, if the determination once again is made that the integrated circuit is not functioning as desired, the process may proceed to block 928 where the integrated circuit may be rejected. If, however, it is determined that the integrated circuit is functioning as desired, the process may proceed to block 924 where the process may terminate.

As is known, when ATE is used to test an integrated circuit, the ATE should be calibrated to ensure that it is providing accurate measurements. As the present invention provides at least selected ATE functionality, calibration of the receiver test circuitry also should be performed. Typical prior art solutions for addressing the issues of calibration have included: designing test circuitry to be self-calibrating; designing test circuitry to be invariant to process, voltage, and temperature (PVT); and not calibrating the test circuitry at all. In regard to self-calibrating test circuitry, such a technique potentially causes the disadvantage of increasing the size of the test circuitry to a size where use of such circuitry within an integrated circuit is no longer practical. In regard to designing the test circuitry to be invariant to PVT, providing such invariance is effectively not possible. For instance, heretofore, a typical solution has been to make any PVT variance easily characterizable and predictable. Additionally, this technique also may cause the size of the circuitry to increase to a point where its use is no longer practical. In regard to deliberately failing to calibrate test circuitry, obviously, such a technique may result in test circuitry producing inaccurate results which may lead to an increase in the number of improperly functioning integrated circuits being shipped or may cause an increase in the number of properly functioning integrated circuits which are rejected from being shipped.

Figure 10:
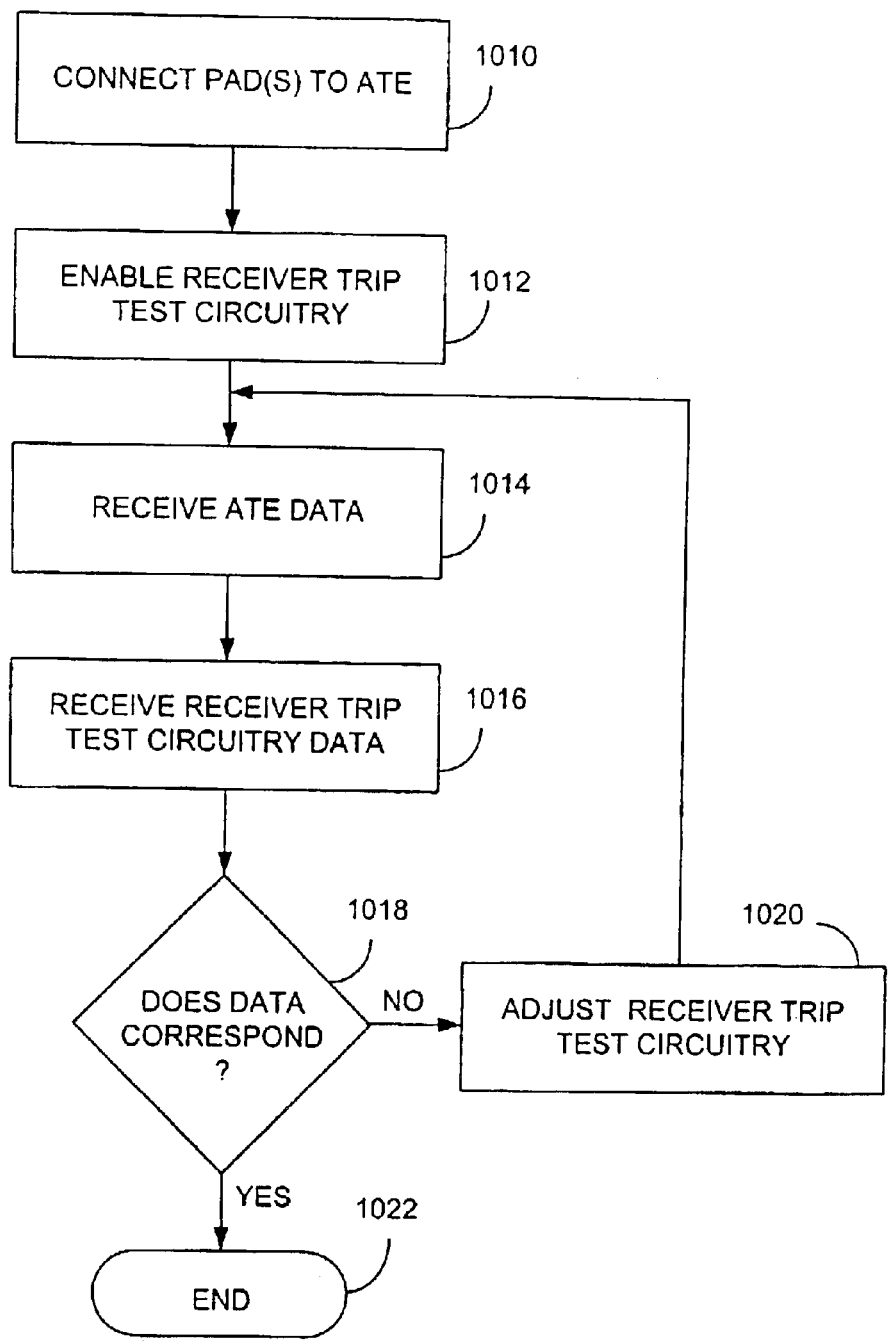
FIG. 10 is a flowchart depicting the functionality of a preferred embodiment of the present invention during calibration.

Since, it is preferable to calibrate the receiver test circuitry of the present invention, the following preferred calibration method is provided for the purpose of illustration, and not for the purpose of limitation. As shown in FIG. 10, a preferred method 900 for calibrating receiver test circuitry preferably begins at block 1010 where designated pads of an integrated circuit to be tested are connected to ATE. Preferably, when a circuit design, e.g., a pad, is used multiple times within an IC, identical receiver test circuitry is associated with each instance of that circuit design. When so configured, connecting of the pads to the ATE, such as depicted in block 910, preferably includes merely connecting the ATE to one or more instances of the circuit design. Since different instances of the repeated circuit design are assumed to be identical in their defect-free electrical behavior, measurements made on the ATE-connected instance of the circuit design may be assumed to correlate to the measurements made at other instances of that circuit design. It should be noted, however, that since each identical instance of the block is assumed to have identical defect-free electrical behavior, only one non-connective pad of each pad type need be utilized, although additional ones of the pads may be utilized for added error detection and comparison.

Proceeding to block 1012, receiver test circuitry is enabled. With both ATE and the appropriate receiver test circuitry now enabled, measurements, such as receiver trip level ($V_{IH}$, $V_{IL}$), for example, may be taken by either or both of the ATE and the receiver test circuitry. Thus, as depicted in blocks 1014 and 1016, the process includes the steps of receiving ATE measurements and receiving receiver test circuitry measurements, respectively. At block 1018, a determination may be made as to whether the ATE measurement data and the receiver test circuitry data appropriately correspond, thereby indicating proper calibration of the receiver test circuitry. If, however, it is determined that the measurements do not correspond, the process may proceed to block 1020 where the receiver test circuitry measurements may be adjusted to match those measurements obtained from the ATE. Thereafter, the process may proceed back to block 1014 and proceed as described hereinbefore until the receiver test circuitry measurements are appropriately calibrated. Once appropriate calibration has been achieved, the process may end, such as depicted in block 1022.

The foregoing description has been presented for purposes of illustration and description. It is not intended to be exhaustive or to limit the invention to the precise forms disclosed. Obvious modifications or variations are possible in light of the above teachings. The embodiment or embodiments discussed, however, were chosen and described to provide the best illustration of the principles of the invention and its practical application to thereby enable one of ordinary skill in the art to utilize the invention in various embodiments and with various modifications as are suited to the particular use contemplated. All such modifications and variations, are within the scope of the invention as determined by the appended claims when interpreted in accordance with the breadth to which they are fairly and legally entitled.

What is claimed is:

1. A method for testing an integrated circuit (IC), to be tested, the IC to be tested having a first pad configured as a signal interface for components external to the IC to be tested, the first pad having a receiver configured to receive a signal from a component external to the IC to be tested and to provide a digital signal in response thereto, said method comprising:

electrically interconnecting automated test equipment (ATE) with the IC to be tested;

providing at least one stimulus from the ATE to the IC to be tested such that the IC to be tested measures a receiver trip-level characteristic of the first pad; and receiving information corresponding to a receiver trip-level characteristic of the first pad to be tested.

2. The method of claim 1, wherein the receiver trip-level characteristic is at least one of receiver low voltage trip level ($V_{IL}$), at which the receiver outputs a logic zero, and receiver high voltage trip level ($V_{IH}$), at which the receiver outputs a logic one.

3. The method of claim 1, wherein providing at least one stimulus from the ATE comprises:

enabling an analog pass gate of the IC to provide a first analog voltage to the receiver of the first pad; and determining a response of the receiver to the first analog voltage.

4. The method of claim 1, wherein the IC has a second pad and a second receiver associated therewith, and wherein providing at least one stimulus comprises enabling an analog pass gate of the IC to provide a first analog voltage to the receiver of the first pad and a second analog voltage to the receiver of the second pad.

5. The method of claim 1, wherein the IC has a plurality of pads, and wherein electrically interconnecting automated test equipment (ATE) with the IC comprises electrically interconnecting the ATE to a subset of the plurality of pads.

6. The method of claim 1, wherein the IC comprises:

a first pad electrically communicating with at least a portion of said IC, said first pad having a first driver and a first receiver, said first driver being configured to provide a first pad output signal to a component external to said IC, said first receiver being configured to receive a first pad input signal from a component external to said IC and to provide, to a component internal to said IC, a first receiver digital output signal in response to the first pad input signal; and a first test circuit internal to said IC and being adapted to provide information corresponding to at least one receiver trip-level characteristic of said first receiver of said first pad.

7. The method of claim 6, wherein the receiver trip-level characteristic is at least one of receiver low voltage trip level ($V_{IL}$), at which the first receiver outputs a logic zero, and receiver high voltage trip level ($V_{IH}$), at which the first receiver outputs a logic one.

8. The method of claim 6, wherein said first test circuit is configured to receive at least one stimulus from automated test equipment (ATE) such that, in response thereto, said first test circuit provides an analog voltage to said first receiver of said first pad.

9. The method of claim 8, wherein said first test circuit has an analog pass gate configured to receive a first stimulus from the ATE such that, in response thereto, said analog pass gate provides an analog voltage to said first receiver of said first pad.

10. The method of claim 8, wherein said first test circuit has a flip-flop configured to register the first receiver digital output signal provided by the first receiver in response to said analog voltage of said first test circuit and the flip-flop can be observed.

11. The method of claim 6, wherein said IC further comprises:

a second pad electrically communicating with at least a portion of said IC, said second pad having a second driver and a second receiver, said second driver being configured to provide a second pad output signal to a component external to said IC, said second receiver being configured to receive a second pad input signal from a component external to said IC and to provide, to a component internal to said IC, a second receiver digital output signal in response to the second pad input signal, and wherein said first test circuit is configured to provide information corresponding to at least one receiver trip-level characteristic of said second receiver of said second pad.

12. The method of claim 6, wherein said IC further comprises:

a second test circuit internal to said IC and being adapted to provide information corresponding to at least one receiver trip-level characteristic of said first receiver of said first pad.

* * * * *